United States Patent
Ota et al.

(10) Patent No.: US 9,653,553 B2
(45) Date of Patent: May 16, 2017

(54) SEMICONDUCTOR SUBSTRATE, SEMICONDUCTOR DEVICE AND METHOD OF MANUFACTURING SEMICONDUCTOR DEVICE

(71) Applicant: Kabushiki Kaisha Toshiba, Minato-ku (JP)

(72) Inventors: Chiharu Ota, Kawasaki (JP); Johji Nishio, Machida (JP); Kazuto Takao, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/055,707

(22) Filed: Feb. 29, 2016

(65) Prior Publication Data
US 2016/0268381 A1    Sep. 15, 2016

(30) Foreign Application Priority Data
Mar. 10, 2015  (JP) ................................ 2015-047222

(51) Int. Cl.
*H01L 29/15* (2006.01)
*H01L 29/16* (2006.01)
(Continued)

(52) U.S. Cl.
CPC .......... *H01L 29/1608* (2013.01); *C30B 29/36* (2013.01); *H01L 29/045* (2013.01);
(Continued)

(58) Field of Classification Search
CPC . H01L 51/56; H01L 51/5016; H01L 51/5056; H01L 51/0072; H01L 51/5072
(Continued)

(56) References Cited

U.S. PATENT DOCUMENTS

| 7,230,274 B2 | 6/2007 | O'Loughlin et al. |
| 2010/0200866 A1* | 8/2010 | Kitou ...................... C30B 25/20 257/77 |

(Continued)

FOREIGN PATENT DOCUMENTS

| JP | 2010-184833 | 8/2010 |
| JP | 2013-129573 | 7/2013 |

(Continued)

OTHER PUBLICATIONS

C. Ota et al. "$V_F$ Degradation of 4H-SiC PiN Diodes Using Low-BPD Wafers", Materials Science Forum, vols. 778-780, 2014, 4 pages.

*Primary Examiner* — Andy Huynh
(74) *Attorney, Agent, or Firm* — Oblon, McClelland, Maier & Neustadt, L.L.P.

(57) ABSTRACT

A semiconductor substrate of an embodiment includes a SiC layer having a surface inclined in a <11-20> direction plus or minus 5° from a {0001} face at an off angle of 0° to 10°. Area density of threading edge dislocation clusters in the SiC layer is 18.8 cm$^{-2}$ or less, each of the threading edge dislocation clusters includes a plurality of threading edge dislocations on the surface, the threading edge dislocations included in each of the threading edge dislocation clusters exist in a region that extends in a [1-100] direction plus or minus 5° and has a width of 30 μm or less, each of the threading edge dislocation clusters includes at least three threading edge dislocations adjacent at an interval of 30 μm or less, and an interval of adjacent threading edge dislocations in each of the threading edge dislocation clusters is 70 μm or less.

11 Claims, 8 Drawing Sheets

(51) Int. Cl.
*H01L 29/04* (2006.01)
*H01L 29/34* (2006.01)
*C30B 29/36* (2006.01)
*H01L 29/32* (2006.01)
*H01L 29/868* (2006.01)
*H01L 21/02* (2006.01)

(52) U.S. Cl.
CPC .............. *H01L 29/32* (2013.01); *H01L 29/34* (2013.01); *H01L 29/868* (2013.01); *H01L 21/02378* (2013.01); *H01L 21/02447* (2013.01); *H01L 21/02529* (2013.01); *H01L 21/02609* (2013.01)

(58) Field of Classification Search
USPC .......................................................... 257/77
See application file for complete search history.

(56) References Cited

U.S. PATENT DOCUMENTS

| | | |
|---|---|---|
| 2013/0009170 A1 | 1/2013 | Momose et al. |
| 2014/0252378 A1 | 9/2014 | Ota et al. |

FOREIGN PATENT DOCUMENTS

| | | |
|---|---|---|
| JP | 2014-159355 | 9/2014 |
| JP | 2014-175412 | 9/2014 |
| WO | WO 2009/035095 A1 | 3/2009 |

\* cited by examiner

SEMICONDUCTOR SUBSTRATE, SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2015-047222, filed on Mar. 10, 2015, the entire contents of which are incorporated herein by reference.

FIELD

Embodiments described herein relate generally to a semiconductor substrate and a semiconductor device.

BACKGROUND

Silicon carbide (SiC) is expected to be a material for a next-generation semiconductor device. SiC has excellent physical properties, such as a triple the band gap, about ten times the breakdown field strength, and about triple the thermal conductivity of silicon (Si). By utilizing the characteristics, a semiconductor device that is low loss and capable of operating at high temperature can be implemented.

On the other hand, in a bipolar device using SiC, a forward ON voltage ($V_F$) may be varied during the device operation. It has been explained that the variation of the forward ON voltage ($V_F$) is caused by expansion of a schockley-type stacking fault (SSF) in the SiC layer due to the injected carrier during the operation of the bipolar. The schockley-type stacking fault occurs due to the propagation of a basal plane dislocation (BPD) in a substrate to an epitaxial growth layer when a SiC layer is formed by epitaxial growth.

DETAILED DESCRIPTION

A semiconductor substrate of an embodiment includes a SiC layer having a surface inclined in a <11-20> direction plus or minus 5° from a {0001} face at an off angle of 0° to 10°, wherein the SiC layer includes threading edge dislocation clusters, each of the threading edge dislocation clusters includes a plurality of threading edge dislocations on the surface, the threading edge dislocations included in each of the threading edge dislocation clusters exist in a region that extends in a [1-100] direction plus or minus 5° and has a width of 30 µm or less, each of the threading edge dislocation clusters includes at least three threading edge dislocations adjacent at an interval of 30 µm or less, an interval of adjacent threading edge dislocations in each of the threading edge dislocation clusters is 70 µm or less, and area density of the threading edge dislocation clusters in the SiC layer is 18.8 $cm^{-2}$ or less.

Hereinafter, embodiments of the present disclosure will be described with reference to the drawings. Note that, in the following description, the same reference signs are assigned to the same members and the like, and the description of the member that has been described will be appropriately omitted.

Furthermore, in the following description, $n^+$, n, and $n^-$, or $p^+$, p, and $p^-$ represent relative levels of impurity concentration in each conductive type. That is, $n^+$ has a relatively higher n-type impurity concentration than n, and $n^-$ has a relatively lower n-type impurity concentration than n. Furthermore, $p^+$ has a relatively higher p-type impurity concentration than p, and $p^-$ has a relatively lower p-type impurity concentration than p. Note that, an $n^+$-type and an $n^-$-type will be also simply referred to as an n-type, and a $p^+$-type and a $p^-$-type will be also simply referred to as a p-type.

A {0001} face represents both of a (0001) face and a (000-1) face. Furthermore a <11-20> direction represents both of a [11-20] direction and a [-1-120] direction.

First Embodiment

A semiconductor substrate of the present embodiment includes a SiC layer including a surface inclined in a <11-20> direction plus or minus 5° from a {0001} face at an off angle of 0° to 10°, and at least one threading edge dislocation cluster, each cluster including a plurality of threading edge dislocations on the surface, the threading edge dislocations existing in a region that extends in a [1-100] direction plus or minus 5° and has a width of 30 µm or less, the threading edge dislocations including at least three threading edge dislocations adjacent at an interval of 30 µm or less, and an interval of adjacent threading edge dislocations in the threading edge dislocations is 70 µm or less, in which area density of the at least one threading edge dislocation cluster is 18.8 $cm^{-2}$ or less.

Figure 1:
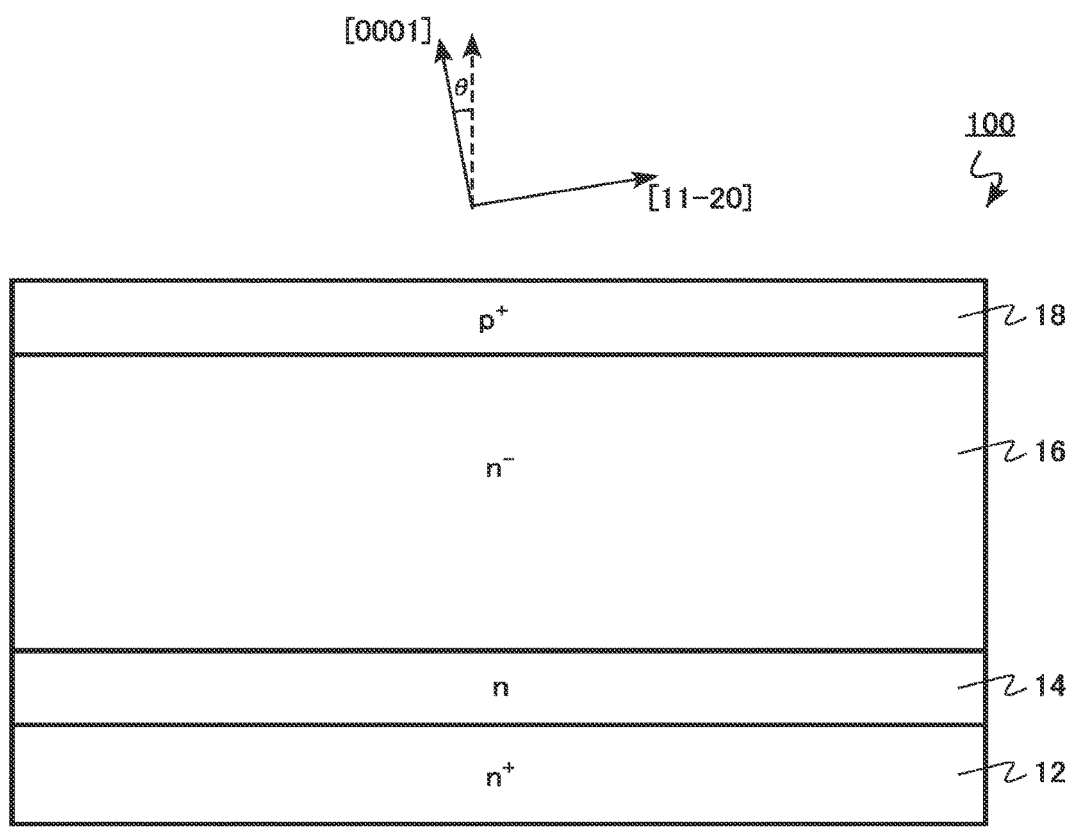
FIG. 1 is a schematic sectional view illustrating a semiconductor substrate of a first embodiment.

FIG. 1 is a schematic sectional view illustrating a semiconductor substrate of the present embodiment. A semiconductor substrate 100 includes an $n^+$-type SiC substrate (SiC substrate) 12, an n-type buffer layer 14, an $n^-$-type SiC layer 16, and a $p^+$-type SiC layer (SiC layer) 18.

Figure 2:
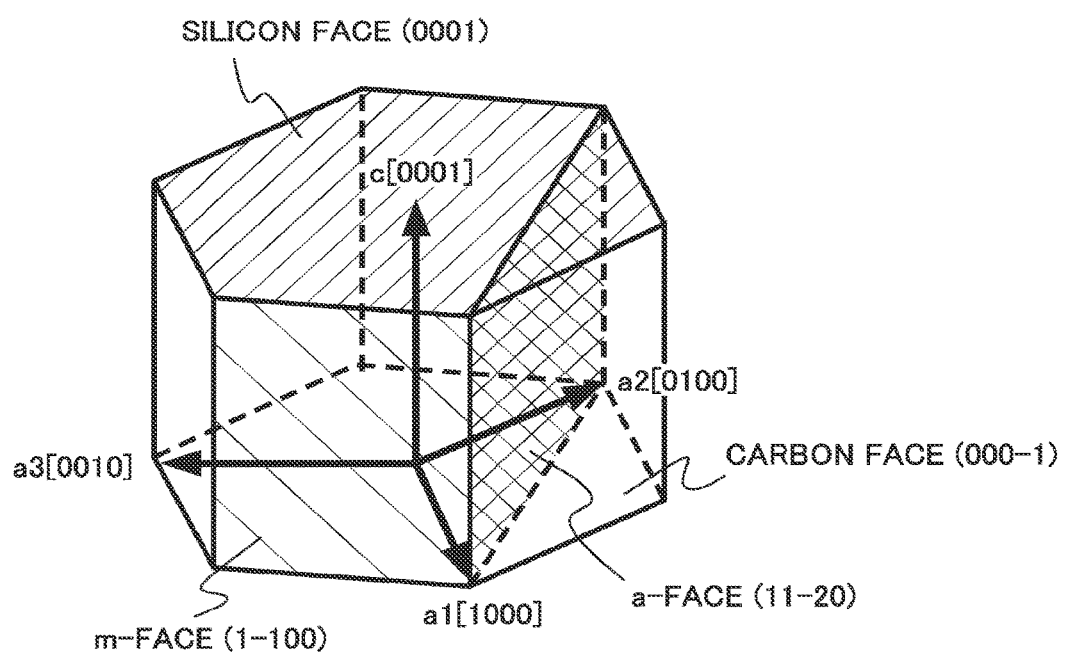
FIG. 2 is a diagram illustrating a crystal structure of SiC.

FIG. 2 is a diagram illustrating a crystal structure of SiC. The representative crystal structure of SiC is a hexagonal crystal system, such as 4H—SiC. A face having a c-axis along the axial direction of the hexagonal prism as a normal line (the top face of the hexagonal prism) is the (0001) face. The other face having the c-axis along the axial direction of the hexagonal prism as the normal line (the top face of the hexagonal prism) is the (000-1) face.

On the other hand, a side face (prismatic face) of the hexagonal prism is an m-face that is equivalent to a (1-100) face, that is, a {1-100} face Furthermore, a face passing a pair of edge lines that are not adjacent to each other is an a-face that is equivalent to a (11-20) face, that is, a {11-20} face.

The $n^+$-type SiC substrate 12 is a 4H—SiC substrate including, for example, nitrogen (N) as an n-type impurity.

The surface of the SiC substrate 12 (the upper face in FIG. 1) is inclined in the [11-20] direction plus or minus 5° from the (0001) face (silicon face) at an off angle θ of 0° to 10°.

The n-type buffer layer 14 and the n⁻-type SiC layer 16 include, for example, nitrogen (N) as the n-type impurity. The n-type buffer layer 14, the n⁻-type SiC layer 16 and the p⁺-type SiC layer 18 are epitaxial growth layers formed on the n⁺-type SiC substrate 12 by epitaxial growth.

The surface of the p⁺-type SiC layer 18 is inclined in the [11-20] direction plus or minus 5° from the (0001) face at the off angle θ of 0° to 10°. The off angle θ is preferably 2° or more and 8° or less. Furthermore, the off angle θ is more preferably 4° plus or minus 0.5°. Note that, the surface of the p⁺-type SiC layer 18 may be a face inclined in the [-1-120] direction plus or minus 5° at the off angle θ of 0° to 10°. In this case, the off angle θ is preferably 2° or more and 8° or less. Furthermore, the off angle θ is more preferably 4° plus or minus 0.5°.

Figure 3:
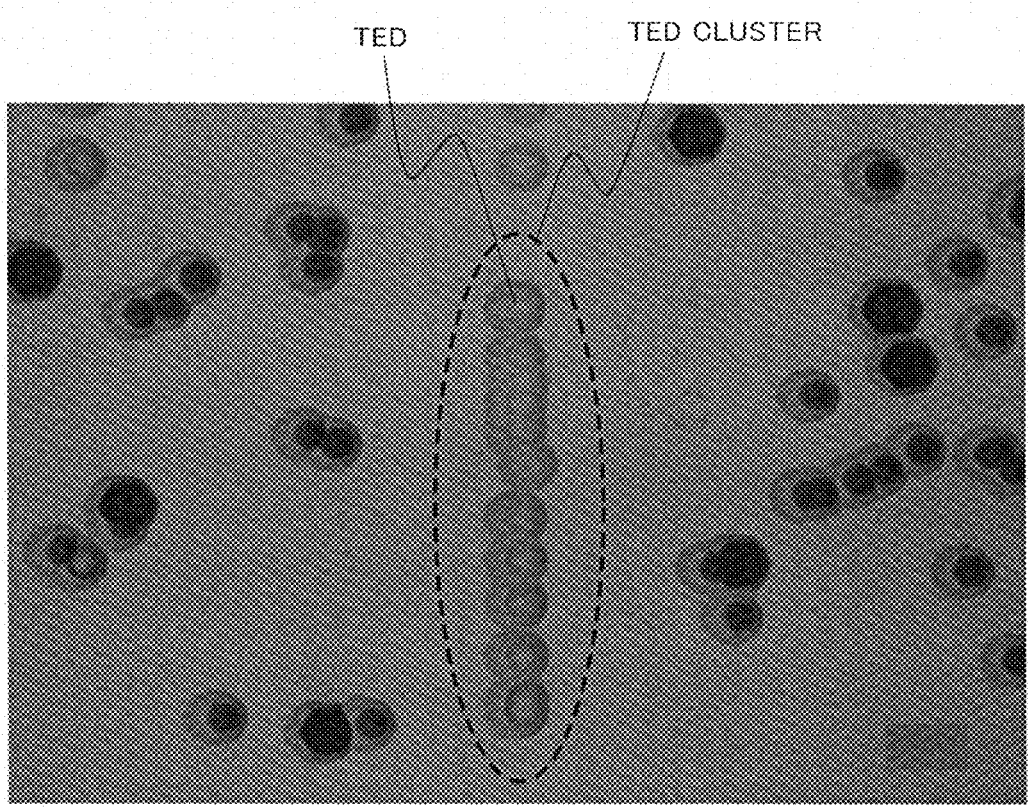
FIG. 3 is an optical microscope photograph of a threading edge dislocation cluster of the first embodiment.
Figure 3:
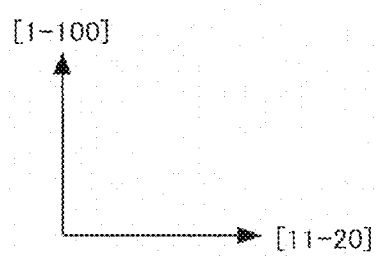
Figure 4:
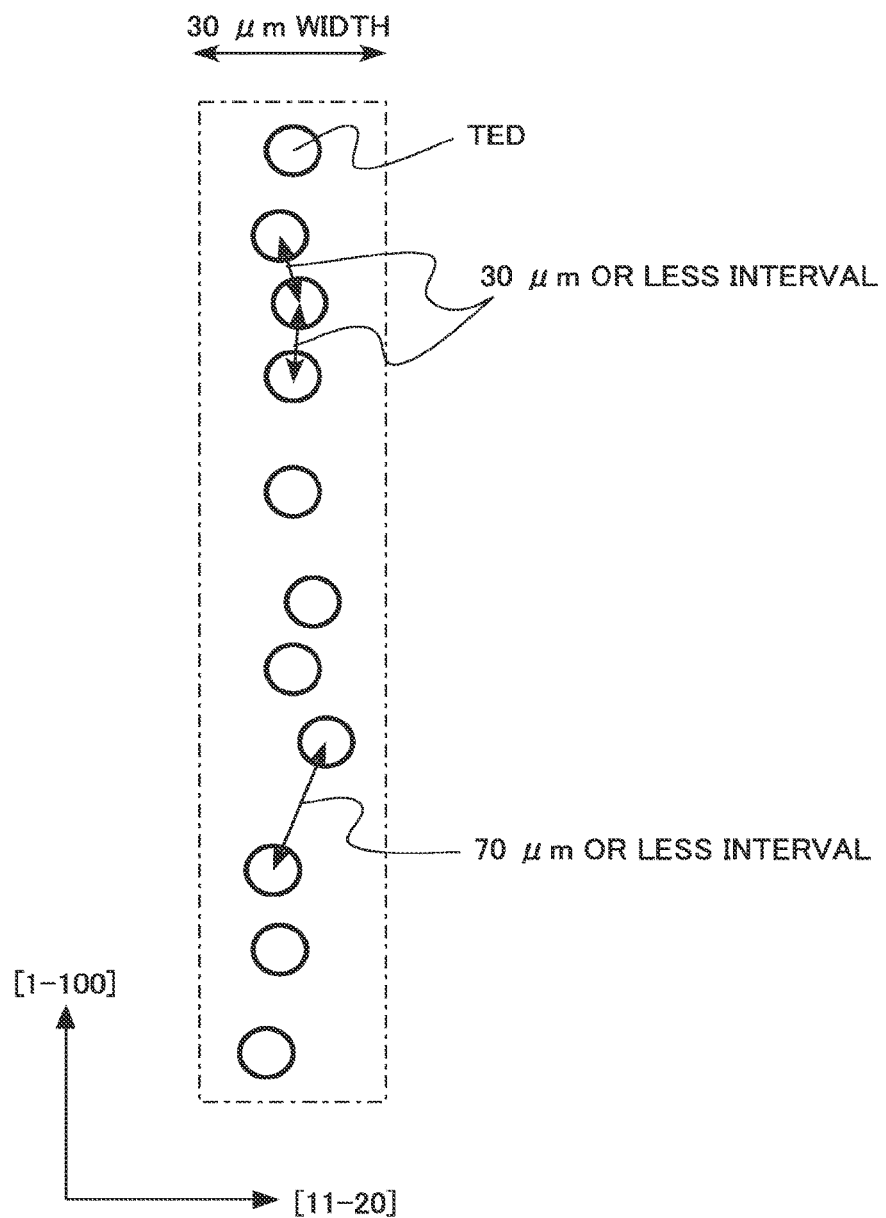
FIG. 4 is a diagram for explaining the threading edge dislocation cluster of the first embodiment.

FIG. 3 is an optical microscope photograph of a threading edge dislocation cluster (hereinafter referred to as a TED cluster) of the present embodiment. The photograph is a KOH-etched surface after forming the p⁺-type SiC layer 18 by the epitaxial growth. FIG. 4 is a diagram for explaining the threading edge dislocation cluster.

The TED cluster exists on the surface of the p⁺-type SiC layer 18. The TED cluster consists of a plurality of threading edge dislocations. In the TED cluster, a plurality of threading edge dislocations exists in a region extending in the [1-100] direction plus or minus 5° and having a width of 30 μm or less and includes at least three threading edge dislocations adjacent at an interval of 30 μm or less. In the plurality of threading edge dislocations, the interval of adjacent threading edge dislocations is 70 μm or less.

Next, a function and an effect of the present embodiment will be described.

In a bipolar device using SiC, a forward ON voltage ($V_F$) may be varied during the device operation. It has been explained that the variation of the forward ON voltage ($V_F$) is caused by expansion of a schockley-type stacking fault (SSF) in the SiC layer due to the injected carrier during the operation of the bipolar. The schockley-type stacking fault mainly occurs due to the propagation of a basal plane dislocation (BPD) in substrate to the epitaxial growth layer when the SiC layer is formed by the epitaxial growth.

The inventors found that the TED cluster existing in the surface of the p⁺-type SiC layer 18 of the semiconductor substrate 100 before forming the device is converted into a BPD-TED complex dislocation in which the TED and the BPD are combined after forming the device.

Figure 5:
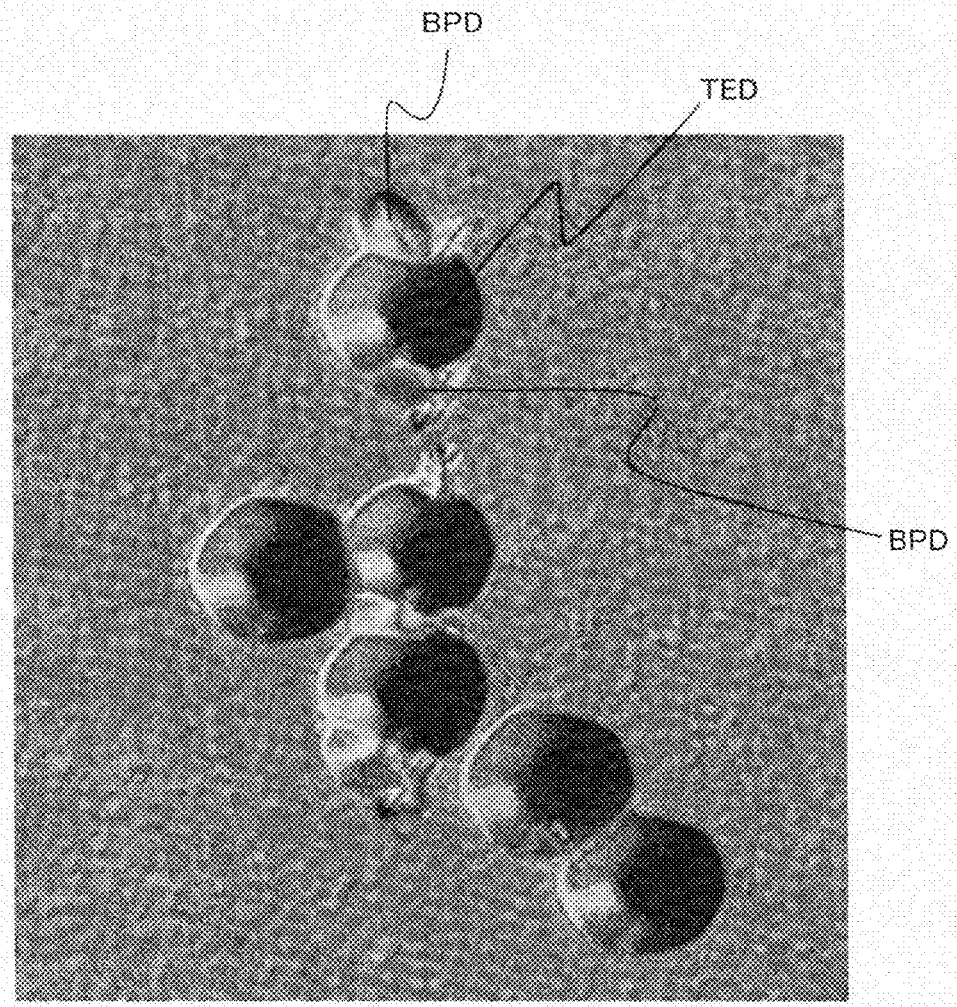
FIG. 5 is an optical microscope photograph of a BPD-TED complex dislocation of the first embodiment.

FIG. 5 is an optical microscope photograph of the BPD-TED complex dislocation. The photograph is a KOH-etched surface after forming the device on the p⁺-type SiC layer 18. The TEDs constituting the TED cluster illustrated in FIGS. 3 and 4 show the growth of the BPD.

Figure 6:
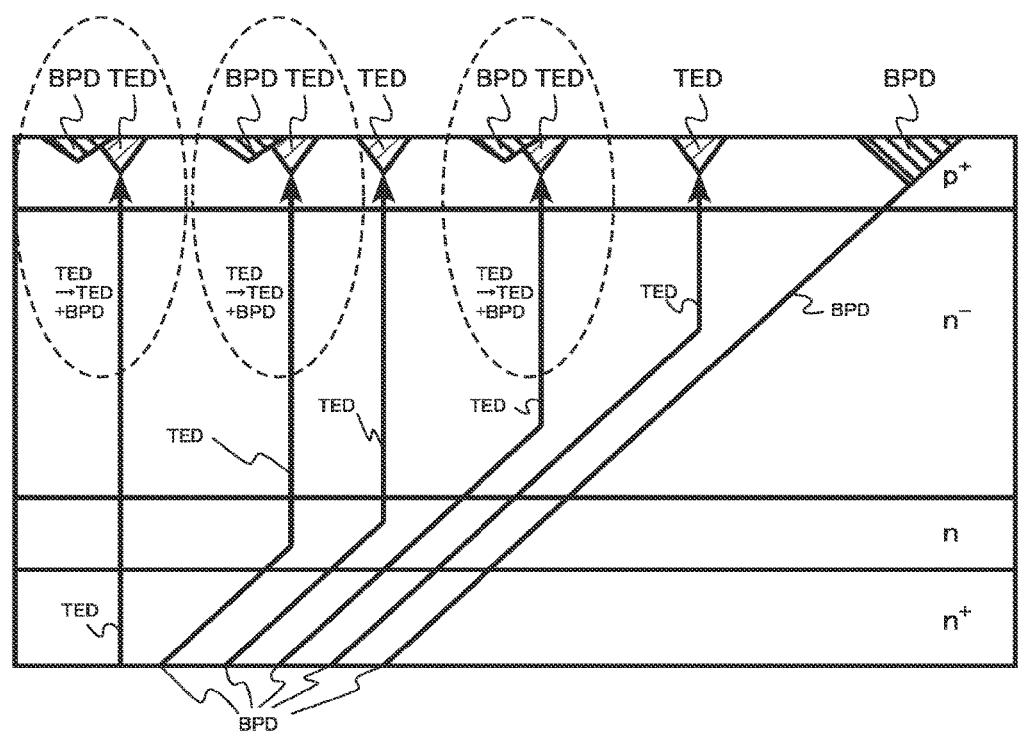
FIG. 6 is a diagram for explaining the BPD-TED complex dislocation of the first embodiment.

FIG. 6 is a diagram explaining the BPD-TED complex dislocation. Most of the BPDs in the n⁺-type SiC substrate 12 are converted into the TEDs and reach the surface of the p⁺-type SiC layer 18 during the epitaxial growth of the n-type buffer layer 14, the n⁻-type SiC layer 16, and the p⁺-type SiC layer 18. Then, a part of the BPDs that are not converted into the TEDs reach the surface of the p⁺-type SiC layer 18. Furthermore, the TEDs existing in the n⁺-type SiC substrate 12 reach the surface of the p'-type SiC layer 18.

The SSF grows in the n⁻-type SiC layer 16 due to the BPDs that reach the surface of the p⁺-type SiC layer 18 during the device operation. It is considered that the SSF becomes a high resistance region and the forward ON voltage ($V_F$) of the device is varied.

As described above, the inventors found a new phenomenon in which the TED cluster, which is specified by the above definition and exists on the surface of the p⁺-type SiC layer 18 of the semiconductor substrate 100 before forming the device, is converted into the BPD-TED complex dislocation, in which the TED and the BPD are combined after forming the device, as indicated by dashed circles in FIG. 6. Then, the inventors demonstrated that the SSF caused by the BPD-TED complex dislocation grows in the n⁻-type SiC layer 16 during the device operation and the SSF causes the variation of the forward ON voltage ($V_F$) of the device.

Figure 7A:
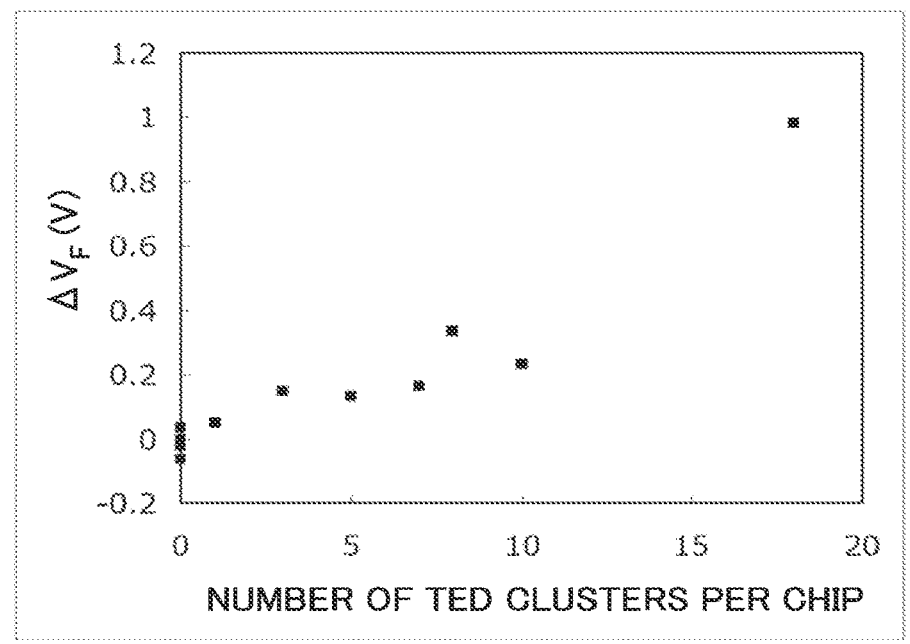
FIGS. 7A and 7B are graphs showing a relation between the number of threading edge dislocation clusters of the first embodiment and a forward ON voltage ($V_F$)
Figure 7B:
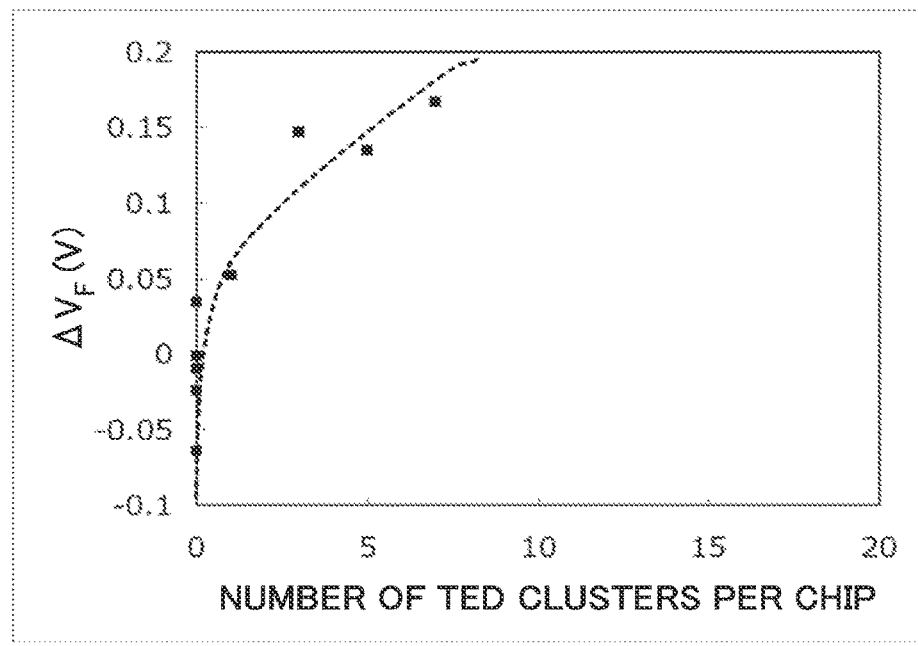

FIGS. 7A and 7B are graphs showing the relation between the number of threading edge dislocation clusters and the forward ON voltage ($V_F$). The horizontal axis is the number of TED clusters on the surface of the n⁻-type SiC layer 16, and the vertical axis is the variation amount ($\Delta V_F$) of the forward ON voltage ($V_F$) after DC stress. FIG. 7B is an enlarged graph of FIG. 7A.

The measurement sample is a plurality of PIN diodes having the area of the device active region of 16=². The used semiconductor substrate 100 includes the n⁺-type SiC substrate 12, the n-type buffer layer 14, the n⁻-type SiC layer 16, and the p⁺-type SiC layer 18. The surface of the p⁺-type SiC layer 18 is inclined in the [11-20] direction from the (0001) face at the off angle of 4°.

The evaluation is performed using the PIN diode formed in the region where the BPD does not exist on the surface after forming the device. The variation ($\Delta V_F$) of the forward ON voltage ($V_F$) is evaluated by applying the DC stress to the PIN diode. The forward ON voltage ($V_F$) is set at the value to generate the forward current of 0.6 A (37 mA/cm²). The number of TED clusters on the surface of the device active region of each PIN diode is counted with an optical microscope. To count the number of TED clusters, an electro-luminescence (EL) image, a photo-luminescence (PL) image, or an X-ray topographic image may be used.

As shown in FIGS. 7A and 7B, the variation amount ($\Delta V_F$) between the number of TED clusters and the forward ON voltage (V) has a positive correlation. The variation amount ($\Delta V_F$) per TED cluster is about 0.03 V. The area of the measured device active region is 16 mm² (=0.16 cm²).

Generally, the allowable value of the variation amount ($\Delta V_F$) of the forward ON voltage ($V_F$) in the bipolar device is 0.1 V, and preferably 0.05 V. According to FIGS. 7A and 7B, in the measured PIN diode, the number of threading edge dislocation clusters is three or less in order for the variation amount ($\Delta V_F$) to be less than or equal to 0.1 V, and the number of threading edge dislocation clusters is two or less in order for the variation amount ($\Delta V_F$) to be less than or equal to 0.05 V. Thus, based on the area of the device active region, the area density of the threading edge dislocation clusters is 18.8 cm⁻² or less, and preferably 12.5 cm⁻². The area density of the threading edge dislocation clusters may be 1.0 cm⁻² or more. The area density of the threading edge dislocation clusters may be 0.1 cm⁻² or more According to the semiconductor substrate of the present embodiment, the area density of the TED clusters is low, and it is possible to suppress the variation of the forward ON voltage. That is, the bipolar device manufactured using the semiconductor substrate of the present embodiment has low variation of the forward ON voltage and high reliability.

Second Embodiment

A semiconductor device of the present embodiment formed with a semiconductor substrate including a SiC layer including a surface inclined in a <11-20> direction plus or minus 5° from a {0001} face at an off angle of 0° to 10°, and at least one threading edge dislocation cluster, each cluster including a plurality of threading edge dislocations on the surface, the threading edge dislocations existing in a region that extends in a [1-100] direction plus or minus 5° and has a width of 30 μm or less, the threading edge dislocations including at least three threading edge dislocations adjacent at an interval of 30 μm or less, and an interval of adjacent threading edge dislocations in the threading edge dislocations is 70 μm or less, in which area density of the at least one threading edge dislocation cluster is 18.8 cm$^{-2}$ or less.

The semiconductor device of the present embodiment is a semiconductor device manufactured using the semiconductor substrate of the first embodiment. Thus, the description overlapping with the first embodiment will be omitted.

Figure 8:
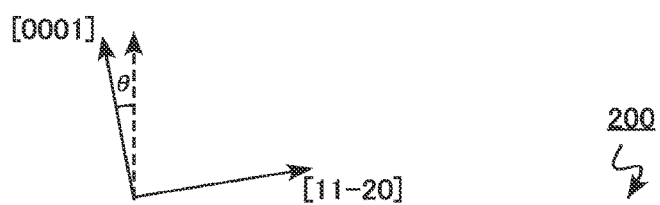
FIG. 8 is a schematic sectional view illustrating a semiconductor device of a second embodiment.
Figure 8:
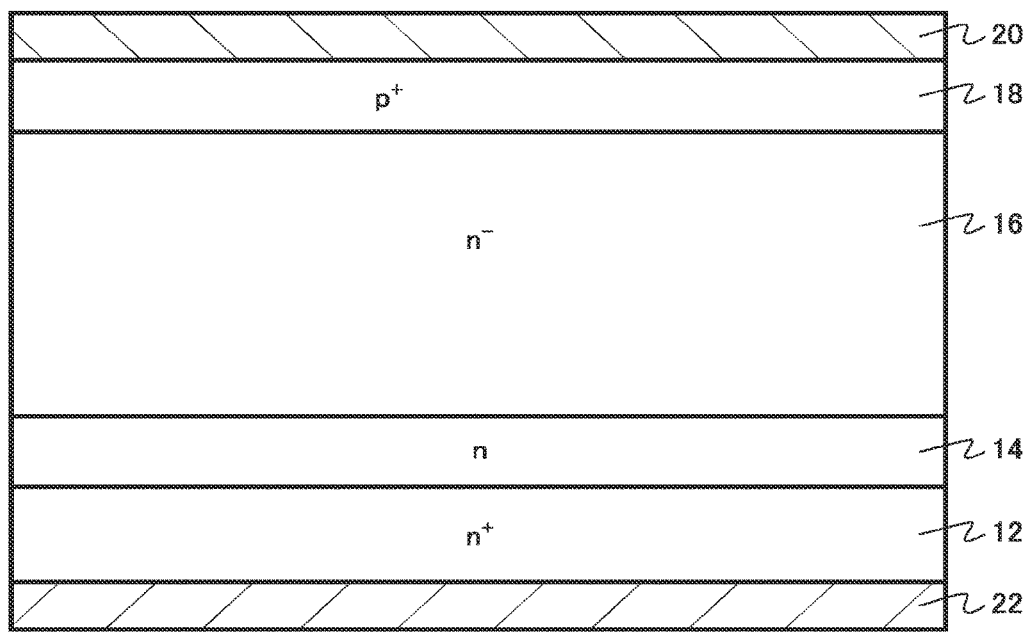

FIG. 8 is a schematic sectional view illustrating a semiconductor device of the present embodiment. The semiconductor device of the present embodiment is a PIN diode.

A PIN diode 200 is a semiconductor substrate manufactured using a semiconductor substrate including an n$^+$-type SiC substrate (SiC substrate) 12, an n-type buffer layer 14, an n$^-$-type SiC layer 16, and a p$^+$-type SiC layer (SiC layer) 18.

The p$^+$-type SiC layer 18 formed on the surface side of the n$^-$-type SiC layer 16 of the PIN diode 200 may be formed by aluminium (Al) ion implantation.

The p$^+$-type SiC layer 18 functions as an anode region of the PIN diode 200. The n$^-$-type SiC layer 16 functions as a drift layer of the PIN diode 200. The n$^+$-type SiC substrate 12 functions as a cathode region of the PIN diode 200.

The PIN diode 200 includes a metal anode electrode 20 on the p$^+$-type SiC layer 18. Furthermore, the PIN diode 200 includes a metal cathode electrode 22 at the n$^+$-type SiC substrate 12 side.

The semiconductor substrate used to manufacture the PIN diode 200 is the semiconductor substrate of the first embodiment. That is, the PIN diode 200 is manufactured using a semiconductor substrate includes a SiC layer including a surface inclined in a <11-20> direction plus or minus 5° from a {0001} face at an off angle of 0° to 10°, and at least one threading edge dislocation cluster, each cluster including a plurality of threading edge dislocations on the surface, the threading edge dislocations existing in a region that extends in a [1-100] direction plus or minus 5° and has a width of 30 μm or less, the threading edge dislocations including at least three threading edge dislocations adjacent at an interval of 30 μm or less, and an interval of adjacent threading edge dislocations in the threading edge dislocations is 70 μm or less, in which area density of the at least one threading edge dislocation cluster is 18.8 cm$^{-2}$ or less. In order to achieve higher reliability, the area density of threading edge dislocation clusters is preferably 12.5 cm$^{-2}$ or less.

The PIN diode 200 of the present embodiment is manufactured using a semiconductor substrate in which the area density of the TED clusters is reduced to a predetermined value or less. Thus, it is possible to suppress the variation of a forward ON voltage. Consequently, the variation of the forward ON voltage is suppressed, and the PIN diode 200 having high reliability can be implemented.

As described above, although it has been described the case where a crystal structure of silicon carbide (SiC) is 4H—SiC in the first and second embodiments, the present disclosure is applicable to silicon carbide having a 6H—SiC crystal structure.

Furthermore, although a p-type SiC layer on an n-type substrate has been exemplified in the first and second embodiments, the present disclosure is also applicable to an n-type SiC layer on an n-type substrate, an n-type SiC layer on a p-type substrate, or a p-type SiC layer on a p-type substrate.

Moreover, although a PIN diode has been exemplified as a semiconductor device in the second embodiment, the present disclosure is also applicable to a semiconductor device other than a PIN diode. For example, the present disclosure is applicable to an insulated gate bipolar transistor (IGBT) that is a bipolar device, a metal-oxide-semiconductor field-effect transistor (MOSFET) in which a part of a device includes a PN junction, a merged PIN/schottky diode (MPS), or a junction barrier schottky (JBS).

While certain embodiments have been described, these embodiments have been presented by way of example only, and are not intended to limit the scope of the inventions. Indeed, the semiconductor substrate, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor substrate comprising:
a SiC layer having a surface inclined in a <11-20> direction plus or minus 5° from a {0001} face at an off angle of 0° to 10°, wherein
the SiC layer includes threading edge dislocation clusters, each of the threading edge dislocation clusters includes a plurality of threading edge dislocations on the surface, the threading edge dislocations included in each of the threading edge dislocation clusters exist in a region that extends in a [1-100] direction plus or minus 5° and has a width of 30 μm or less, each of the threading edge dislocation clusters includes at least three threading edge dislocations adjacent at an interval of 30 μm or less, an interval of adjacent threading edge dislocations in each of the threading edge dislocation clusters is 70 μm or less, and area density of the threading edge dislocation clusters in the SiC layer is 18.8 cm$^{-2}$ or less.

2. The semiconductor substrate according to claim 1, wherein
the area density of the threading edge dislocation clusters is 12.5 cm$^{-2}$ or less.

3. The semiconductor substrate according to claim 1, further comprising a SiC substrate, wherein
the SiC layer is provided on or above the SiC substrate.

4. The semiconductor substrate according to claim 1, wherein
the SiC layer is an epitaxial growth layer.

5. The semiconductor substrate according to claim 1, wherein
the surface is inclined in the <11-20> direction plus or minus 5° from a (0001) face at an off angle of 0° to 10°.

6. The semiconductor substrate according to claim 1, wherein the off angle is 4° plus or minus 0.5°.

7. A semiconductor device formed with a semiconductor substrate, comprising:

the semiconductor substrate including a SiC layer having a surface inclined in a <11-20> direction plus or minus 5° from a {0001} face at an off angle of 0° to 10°, wherein the SiC layer includes threading edge dislocation clusters, each of the threading edge dislocation clusters includes a plurality of threading edge dislocations on the surface, the threading edge dislocations included in each of the threading edge dislocation clusters exist in a region that extends in a [1-100] direction plus or minus 5° and has a width of 30 μm or less, each of the threading edge dislocation clusters includes at least three threading edge dislocations adjacent at an interval of 30 μm or less, an interval of adjacent threading edge dislocations in each of the threading edge dislocation clusters is 70 μm or less, and area density of the threading edge dislocation clusters in the SiC layer is 18.8 $cm^{-2}$ or less.

8. The semiconductor device according to claim 7, wherein
the area density of the threading edge dislocation clusters is 12.5 $cm^{-2}$ or less.

9. The semiconductor device according to claim 7, wherein
the SiC layer is an epitaxial growth layer.

10. The semiconductor device according to claim 7, wherein
the surface is inclined in the <11-20> direction plus or minus 5° from a (0001) face at an off angle of 0° to 10°.

11. The semiconductor device according to claim 7, wherein the off angle is 4° plus or minus 0.5°.

* * * * *